(12) United States Patent
Davids et al.

(10) Patent No.: US 9,437,629 B1
(45) Date of Patent: Sep. 6, 2016

(54) RECTENNA THAT CONVERTS INFRARED RADIATION TO ELECTRICAL ENERGY

(71) Applicant: Sandia Corporation, Albuquerque, NM (US)

(72) Inventors: Paul Davids, Albuquerque, NM (US); David W. Peters, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 14/834,514

(22) Filed: Aug. 25, 2015

Related U.S. Application Data

(60) Provisional application No. 62/127,119, filed on Mar. 2, 2015.

(51) Int. Cl.
| | | |
|---|---|---|
| *H01L 27/144* | (2006.01) |
| *H01L 31/18* | (2006.01) |
| *H01L 29/88* | (2006.01) |
| *H01L 31/09* | (2006.01) |

(52) U.S. Cl.
CPC ............ *H01L 27/144* (2013.01); *H01L 29/88* (2013.01); *H01L 31/09* (2013.01); *H01L 31/18* (2013.01)

(58) Field of Classification Search
CPC ...... H01Q 1/38; H01Q 1/2283; H01Q 1/243; H01L 31/1085; H01L 31/18; H01L 31/09; H01L 31/101; H01L 29/88; H01L 51/4206

USPC ............. 136/206, 243–465; 250/336.1–395; 257/14–39, 53–61, 104–106, 431–466; 438/57–98; 343/701–916
See application file for complete search history.

(56) References Cited

U.S. PATENT DOCUMENTS

| | | | |
|---|---|---|---|
| 6,369,759 B1 | 4/2002 | Epp et al. | |
| 7,091,918 B1 * | 8/2006 | Bhansali | H01Q 1/248 343/767 |
| 7,329,871 B2 | 2/2008 | Fan et al. | |
| 7,352,468 B2 | 4/2008 | Tarsa | |
| 7,501,636 B1 * | 3/2009 | Son | G01J 5/02 250/370.14 |
| 7,531,805 B1 | 5/2009 | Gregoire et al. | |
| 8,115,683 B1 | 2/2012 | Stefanakos et al. | |
| 8,452,134 B1 * | 5/2013 | Davids | G01J 1/42 385/12 |
| 8,618,985 B2 | 12/2013 | Park et al. | |
| 8,897,609 B1 | 11/2014 | Davids et al. | |
| 2011/0156189 A1 | 6/2011 | Gravrand et al. | |
| 2013/0276861 A1 * | 10/2013 | Cooke | H01L 31/09 136/246 |
| 2014/0001876 A1 | 1/2014 | Fujiwara et al. | |

OTHER PUBLICATIONS

Hagerty, et al., "Recycling Ambient Microwave Energy With Broad-Band Rectenna Arrays", IEEE Transactions on Microwave Theory and Techniques, vol. 52, No. 3, Mar. 2004, pp. 1014-1024.
Suh, et al., "A High-Efficiency Dual-Frequency Rectenna for 2.45- and 5.8-GHz Wireless Power Transmission", IEEE Transactions on Microwave Theory and Techniques, vol. 50, No. 7, Jul. 2002, pp. 1784-1789.

* cited by examiner

*Primary Examiner* — Karen Kusumakar
(74) *Attorney, Agent, or Firm* — Medley, Behrens & Lewis LLC; Aman Talwar (57) ABSTRACT

Technologies pertaining to converting infrared (IR) radiation to DC energy are described herein. In a general embodiment, a rectenna comprises a conductive layer. A thin insulator layer is formed on the conductive layer, and a nanoantenna is formed on the thin insulator layer. The thin insulator layer acts as a tunnel junction of a tunnel diode.

20 Claims, 7 Drawing Sheets

RECTENNA THAT CONVERTS INFRARED RADIATION TO ELECTRICAL ENERGY

RELATED APPLICATION

This application claims priority to U.S. Provisional Patent Application No. 62/127,119, filed on Mar. 2, 2015, and entitled "INFRARED RECTENNA FOR THERMAL ENERGY HARVESTING", the entirety of which is incorporated herein by reference.

STATEMENT OF GOVERNMENTAL INTEREST

This invention was developed under Contract DE-AC04-94AL85000 between Sandia Corporation and the U.S. Department of Energy. The U.S. Government has certain rights in this invention.

BACKGROUND

Direct conversion and detection of electromagnetic energy has conventionally been developed in the microwave region of the electromagnetic spectrum, where high-speed nonlinear rectifying elements, such as Schottky diodes, exist and relatively high conversion efficiencies have been attained. Wireless energy transfer to power remote devices based on radiofrequency (RF) and microwave direct rectification have been shown to be highly efficient, with greater than 84% conversion efficiency at 2.45 GHz. These direct conversion devices utilize discrete element diodes and well-developed antenna designs with impedance matching techniques to directly convert microwave radiation into a rectified direct-current.

Principles utilized in designing these devices, however, are not readily applicable for conversion of infrared (IR) radiation into electricity. With more particularity, scaling down one of the devices described above, such that elements of these devices more readily conform to IR signals has been found to be suboptimal. This is at least partially because the rectifying elements cannot be treated as lumped element devices. Moreover, carrier transport effects in semiconductor diodes are too slow to allow for direct conversion of IR radiation to electrical energy.

SUMMARY

Technologies pertaining to an apparatus that converts infrared (IR) radiation to direct current (DC) electrical energy are disclosed herein. In a general embodiment, the present disclosure provides a device referred to herein as a rectenna. The rectenna comprises a nanoantenna and a rectifying tunnel diode, where the rectifying tunnel diode is intimately integrated with the nanoantenna. IR radiation incident upon the nanoantenna is converted to DC electrical energy by way of the rectifying tunnel diode. The nanoantenna can be or include a metal gating (which includes a plurality of parallel metal bars) or a metal frequency selective surface (FSS), wherein the grating or the FSS are formed of a suitable metal, such as aluminum. The nanoantenna forms one terminal of the rectifying diode, the other terminal is a solid layer of conducting material, which can either be a metal or a semiconductor doped to a level such that it is conductive. Between the solid metal layer and the patterned metal of the nanoantenna is a thin insulator layer formed of insulating material. For example, the thin insulator layer may be a layer of silicon dioxide. The metal gating or FSS, the insulator layer, and the conductive bottom layer collectively form the rectifying tunnel diode.

The rectenna is particularly well-suited to generate electrical energy based upon waste heat emitted from a heat source. Accordingly, the rectenna can be integrated with a photovoltaic (PV) cell to enhance efficiency of the PV cell. In another example, the rectenna can be placed proximate a light source, which emits heat as well as light. Other applications will be readily contemplated by one skilled in the art. IR radiation, incident upon the rectenna, excites the nanoantenna. The nanoantenna, responsive to being excited, confines the IR radiation into a small volume and in the thin insulator layer (e.g., a 2-5.5 nanometer gap). In other words, the IR radiation is coupled into a tunnel junction of the rectifying tunnel diode, forming an electric field that oscillates perpendicularly to the tunnel junction. This in turn gives rise to an enhanced tunnel current. The tunnel diode responds very quickly, resulting in formation of DC electrical energy that can be extracted from the rectum.

Additional features and advantages are described herein, and will be apparent from the following Detailed Description and the figures.

DETAILED DESCRIPTION

Figure 1:
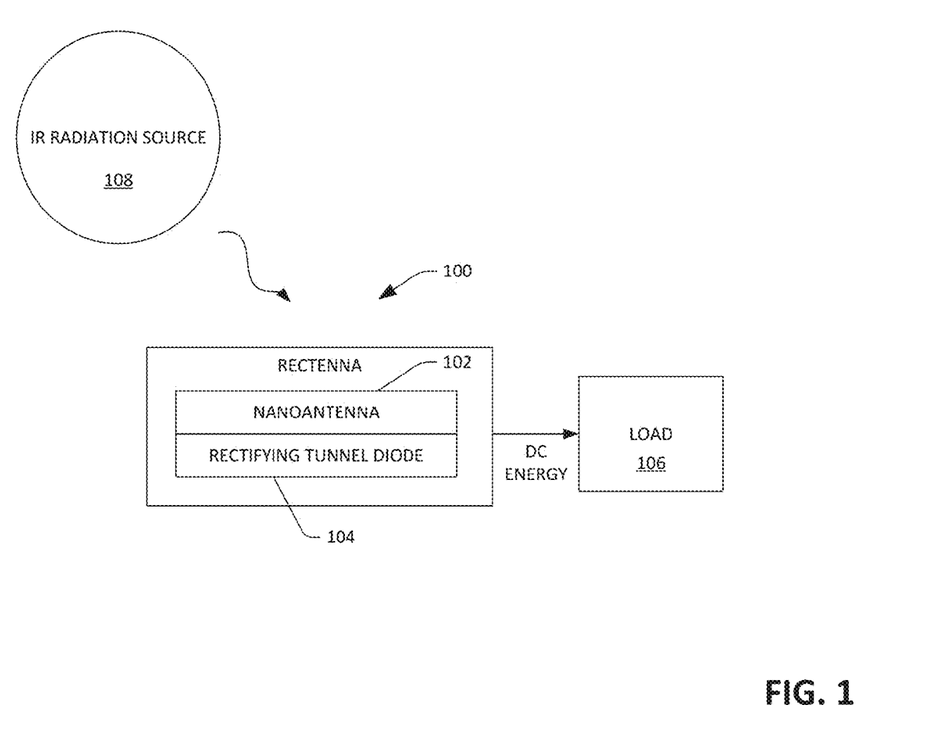
FIG. 1 is a schematic illustrating an exemplary rectenna.

Technologies pertaining to a rectenna that is configured to convert infrared (IR) radiation to direct-current (DC) electrical energy are disclose herein. With reference now to FIG. 1, in a general embodiment, a schematic illustrating an exemplary rectenna 100 is illustrated. As will be described herein, the rectenna 100 is configured to convert infrared (IR) radiation into direct current (DC) electrical energy. The rectenna 100 comprises a nanoantenna 102. The term "nanoantenna" refers to an antenna with features on the nanoscale. As will be described in greater detail below, the nanoantenna 102 can be or include a metal grating that comprises a plurality of periodically spaced-apart bars, wherein the metal can be, for example, Aluminum (Al). In another example, the nanoantenna 102 can be or include a frequency selective surface (FSS), such as any of those described in U.S. Pat. No. 8,897,609, issued on Nov. 25, 2014, the entirety of which is incorporated herein by reference.

The rectenna 100 further includes a rectifying tunnel diode 104 that is intimately integrated with the nanoantenna 102 in the rectenna 100. For example, and as will be illustrated below, the rectifying tunnel diode 104 can be formed through placement of a thin insulator layer between the nanoantenna 102 and a conductive layer. In an example, the thin insulator layer may be a gate oxide layer.

The rectenna 100 further includes electrical contacts (not shown), and a load 106 having a suitable impedance can be coupled to the electrical contacts of the rectenna 100 to generate optimal power, such that the rectenna 100 provides DC electricity to the load 106. For example, the load 106 may be a suitably chosen resistor, capacitor, inductor, or any combination of these elements. The load 106 may also comprise a battery, a light, an alarm, or other suitable load. In operation, the rectenna 100 is placed in sight of an IR radiation source 108. For example, the IR radiation source 108 may be a light, a vehicle engine, a photovoltaic (PV) cell, a processor, or other mechanism that emits waste heat (e.g., that is warmer than the rectenna 100). A distance between the IR radiation source 108 and the rectenna 100 can be relatively small to a near-infinite distance.

Operation of the rectenna 100 is now set forth. The nanoantenna 102 is excited by IR radiation emitted from the IR radiation source 108 that is incident upon the rectenna 100. The nanoantenna 102 concentrates the IR radiation into a small volume and in a fairly narrow spectral band (e.g., with wavelengths on the order of 2-20 microns). The tight electromagnetic confinement of optical fields into nanoscale gaps allows for enhancement of electronic tunneling through the tunnel barrier (the thin insulator layer, which can be a gate oxide). Large transverse electric fields in thin nanoscale gaps create large displacement currents resulting from the time-varying electric field in the tunnel barrier. This form of direct conversion requires extremely fast rectification, which can be achieved by direct tunneling in devices with highly asymmetric electrical response. The confinement of the optical fields in the device structure is due to the nanoantenna resonant coupling of infrared radiation into the tunnel diode structure.

The rectenna can be placed in close proximity of the thermal source such that evanescent wave coupling can be used to enhance the power transfer from hot source to cooler rectenna. This will generate enhanced heat to electrical conversion at distances less than the thermal wavelength ($\lambda$=hc/kT), with typical spacing less than 1000 nm. The end result is tunneling of current through the tunnel barrier, and the rectifying tunnel diode 104 converts IR radiation into DC energy, which is used to drive the load 106.

Figures 2, 3:
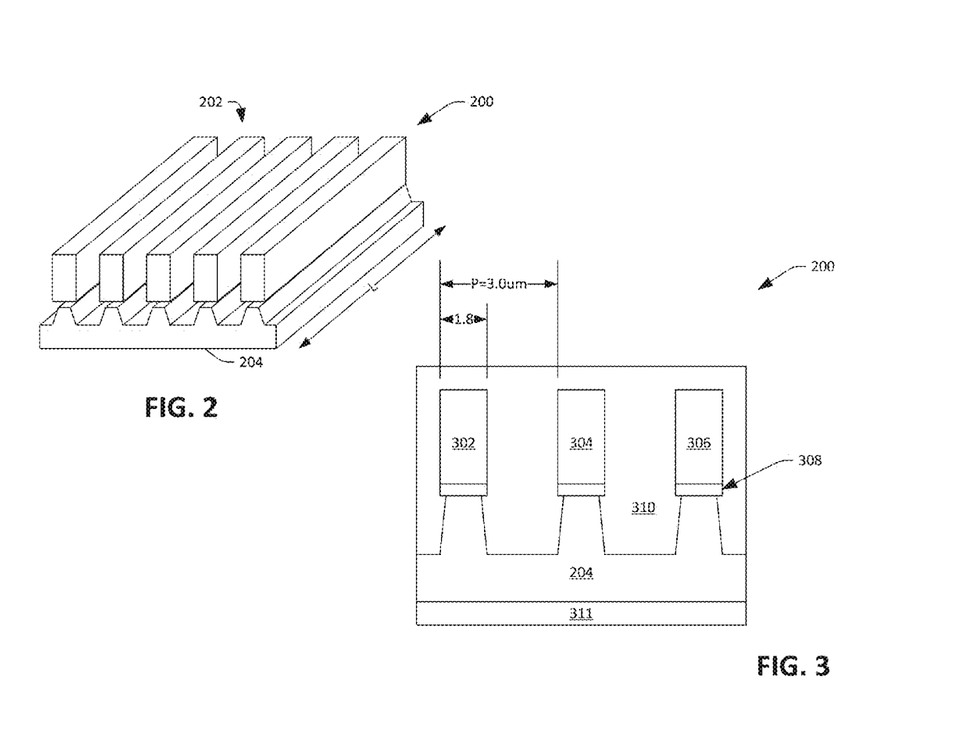
FIG. 2 is an isometric view of an exemplary rectenna.
FIG. 3 is a cross-sectional view of the exemplary rectenna shown in FIG. 3.

With reference now to FIG. 2, an isometric view of a portion of an exemplary rectenna 200 is illustrated. The rectenna 200 comprises a nanoantenna 202, which is illustrated as being a metal grating that comprises a plurality of periodically spaced bars. It is to be understood, however, that the nanoantenna can comprise some other shape in a conductive material that is patterned. In an example, the conductive material can be aluminum. The rectenna 200 also comprises a conductive layer 204, wherein the conductive layer 204 comprises ridges that respectively correspond to the parallel bars of metal grating. In an example, the conductive layer 204 can be an n-type substrate or a p-type substrate, sufficiently doped such that the substrate is conductive. In another example, the conductive layer 204 can be a metal conductive layer. As will be described below, these ridges can be formed by over-etching through the conductive material of the nanoantenna and into the conductive layer 204 (e.g., to a desired depth in the conductive layer 204). While not shown in FIG. 2, between each ridge of the substrate and a corresponding bar in the metal grating is a thin layer of insulator. In an example, the insulator can be silicon dioxide, and the thickness of the layer of insulator can be between 2 nm and 5.5 nm. The insulator layer, as noted above, acts as a tunnel barrier of the rectifying tunnel diode 104.

With reference now to FIG. 3, a cross-sectional view of the exemplary rectenna 200 is illustrated. As depicted, the nanoantenna 202 includes a plurality of parallel bars 302-306. In a non-limiting example, a period P of the grating formed by the bars 302-306 can be between 1.0 and 10.0 µm, dependent on materials used and wavelength of radiation to be converted. In a more specific example, the period of the grating can be approximately 3.0 µm. Furthermore, each of the bars 302-306 may have a width W between 30% and 70% of the period. In a more particular example, the width of each bar can be approximately 1.8 µm. Generally, the bars 302-306 have a uniform width, although it is contemplated that some bars in the grating may have widths different than other bars in the grating. Additionally the period of the grating (or FSS) may vary across the surface of the rectenna to broaden the bandwidth of the device. Therefore, the nanoantenna 202 is not limited to rectilinear designs, but can include spirals or other shapes.

Further, as indicated above, the rectenna 200 can comprise a relatively thin layer of insulator 308 that is positioned between each of the bars 302-306 and the conductive layer 204 (e.g., between the bars 302-306 and the respective ridges of the conductive layer 204). The thickness of the layer of insulator 308 can be between 2 nm and 5.5 nm. In a more specific example, the thickness of the layer of insulator 308 can be approximately 3.5 nm. The rectenna 200 also includes silicon oxide 310 that is layered over the nanoantenna 202, such that the bars 302-306 are separated from one another by silicon oxide. The rectenna 200 also includes a supporting substrate 311. The combination of a metal bar, the insulator, and the conductive layer forms a rectifying tunnel diode (e.g., the cross-sectional view shown in FIG. 3 depicts three tunnel diodes).

As can be ascertained, in the rectenna 200, rectifying tunnel diodes are produced along a length L of the rectenna 200. Due to the precision in which semiconductor manufacturing techniques can place layers of material together, the tunnel diodes may have a relatively long length, on the order of several inches if desired. Further, as will be described in greater detail below, the nanoantenna 202, rather than being a periodic linear grating, may be a FSS, in which case the rectenna responds to light of both incident polarizations.

In view of the above, it can be ascertained that the rectenna 200 can be characterized as a large area IR nanoantenna with an integrated tunnel diode. The conductive layer 204 can be, for example, a heavily n-type doped silicon, and the supporting substrate 311 can be an n-type epitaxial substrate, which acts as an electrical contact. The layer of insulator 308 can be grown directly on the conductive layer 204. The thin nature of the insulator 308 allows for direct band-to-band tunneling between the metal of the bars 302-306 and the conductive layer 204. Further, as described above, the entire rectenna 200 can be over-clad with a protective oxide to a depth of approximately 200 nm.

A brief explanation of operation of the rectenna 200 follows. It has been observed that spatially, for one period of the grating, half of the tunnel diode is forward-biased and half is reverse-biased. The resulting sinusoidally varying voltage on the diode and the nonlinearity of the diode leads to a net DC current flow. The nonlinearity of the diode arises from its electronic band structure, where electron tunnel currents result in relatively large diode asymmetry. Accordingly, optimum target wavelength and bandwidth for the rectenna 200 can be determined to best match the temperature of the radiation source 108, the IR coupling, and the diode nonlinearity. This implies that fabrication, material selection, nanoantenna design, and operational temperatures are tightly coupled.

Figure 4:
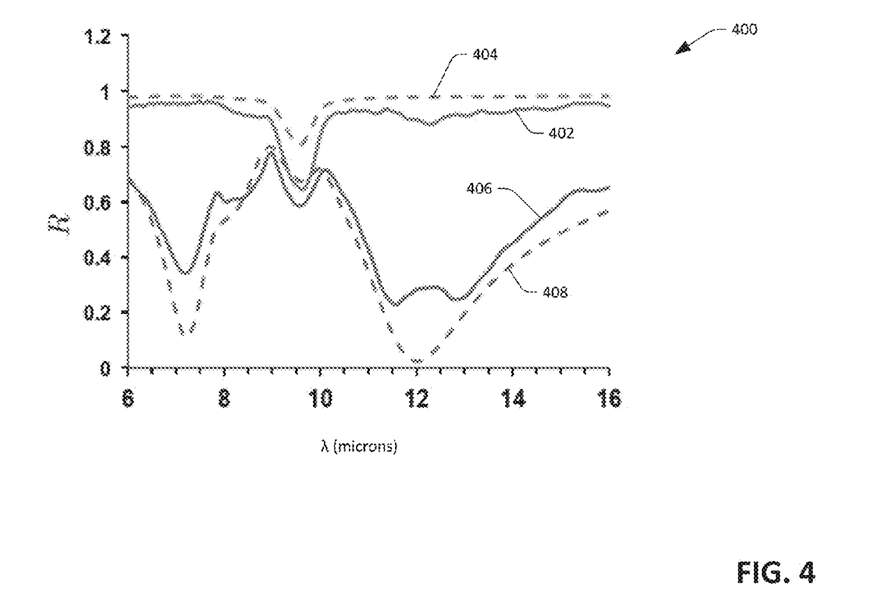
FIG. 4 is a chart that illustrates measured and simulated reflection spectra for TE and TM polarization for an exemplary rectenna.

FIG. 4 depicts a chart 400 that illustrates the measured (solid) and simulated (dashed) reflection spectra for TE and TM reflections for the exemplary rectenna 200. With more particularity, the chart 400 includes a solid line 402 that depicts a measured TE reflection for the exemplary rectenna 200, a dashed line 404 that depicts a simulated TE reflection for the exemplary rectenna 200, a solid line 406 that depicts a measured TM reflection for the exemplary rectenna 200, and a dashed line 408 that depicts a simulate TM reflection for the exemplary rectenna 200. The TE reflection is polarized parallel to the grating shown in FIG. 2, and the TM reflection is polarized perpendicular to the grating shown in FIG. 2.

Electromagnetic modeling of the tunnel diode structures of the rectenna 200 has been performed to examine the photon/phonon enhancement in the nanometer scale insulator layer. The simulated structure had an insulator layer of 5 nm. The peak field enhancement was found to be 16 times the incident field values, and was observed to be as large as 25-30 times the incident field values for different materials and design parameters. The large transverse field in the gap enhances the tunneling current under bias, since the transverse field appears as a distributed bias voltage across the tunnel diode of the rectenna 200. The time-varying electric field in the insulator layer acts as a distributed direct converter of IR radiation into rectified DC currents.

Figure 5:
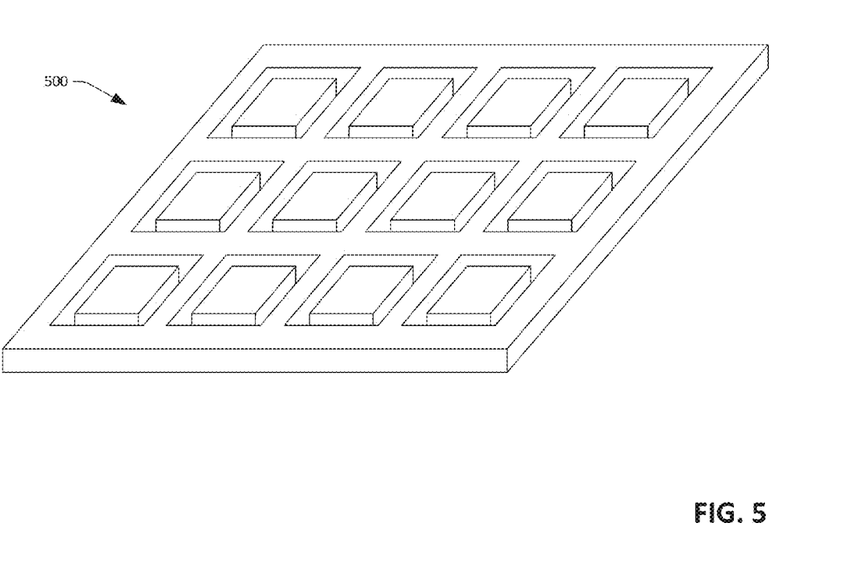
FIG. 5 is an isometric view of an exemplary frequency selective surface (FSS) they can be used as a nanoantenna in the rectenna.

Referring now to FIG. 5, an exemplary frequently selective surface 500 is illustrated. The nanoantenna 102 of the rectenna 100 can be or include the frequency selective surface 500, which is more fully described in the United States Patent referenced above. Use of the FSS 500 as the nanoantenna 102 may be advantageous over the grating depicted in FIGS. 2 and 3, since it is polarization-independent, resulting in potential improved performance.

Figure 6:
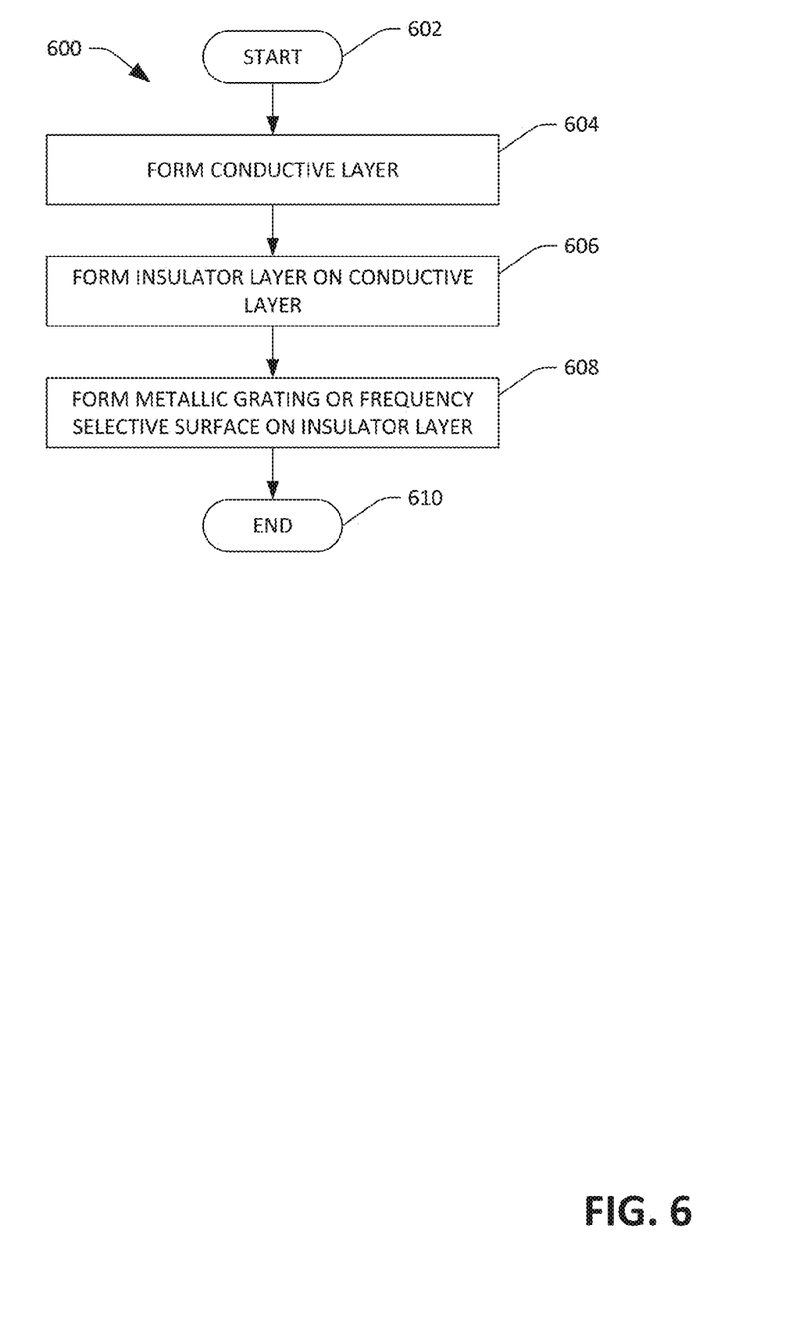
FIG. 6 is a flow diagram illustrating an exemplary methodology for forming a rectenna.
Figure 7:
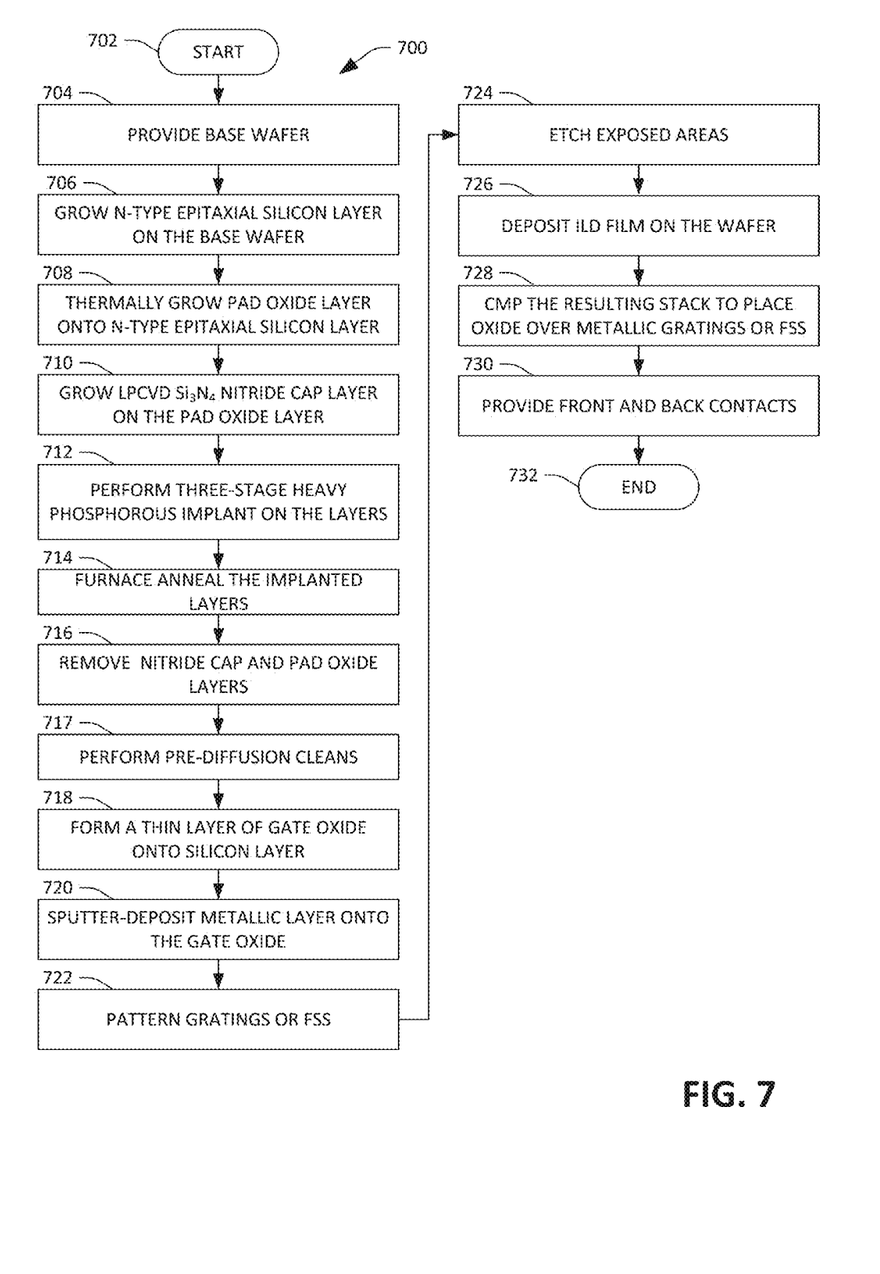
FIG. 7 is a flow diagram illustrating an exemplary methodology for forming a rectenna.
Figure 8:
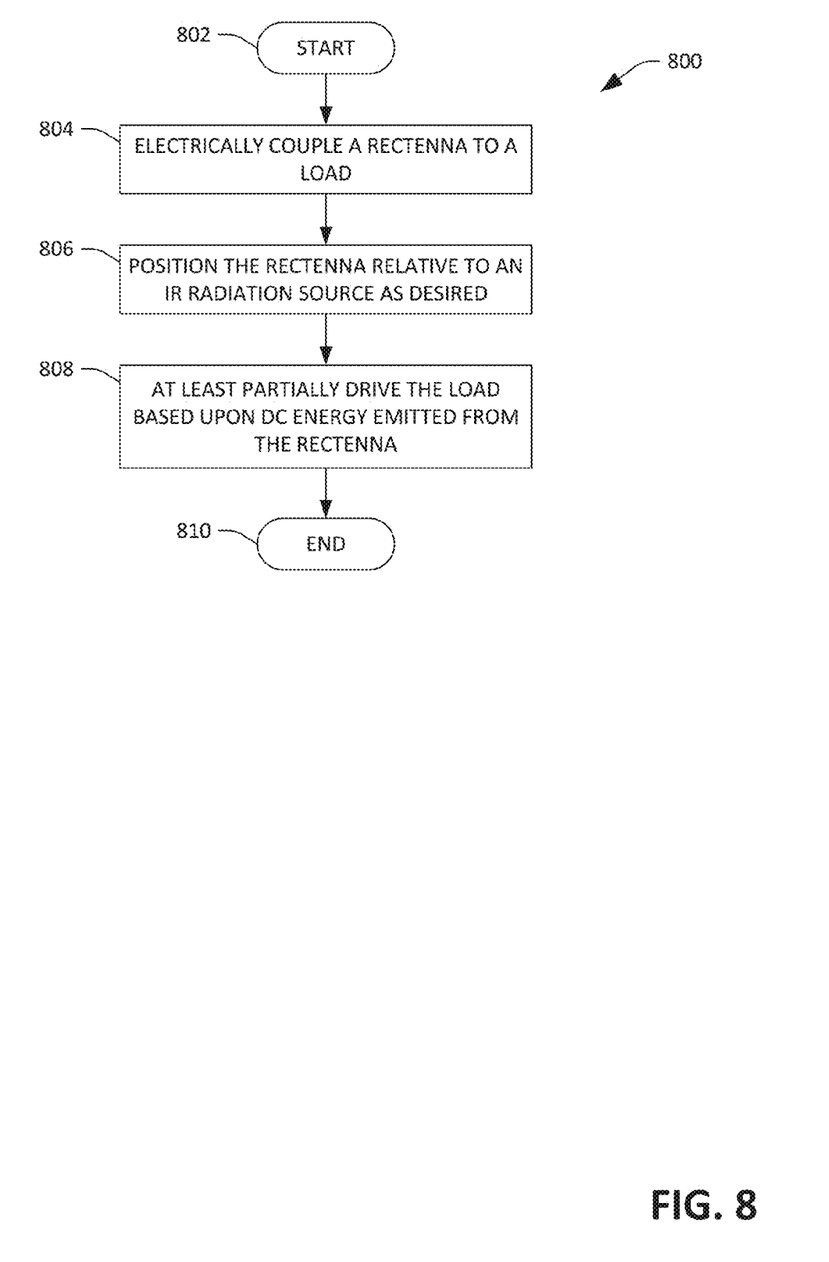
FIG. 8 is a flow diagram illustrating an exemplary methodology for operating a rectenna.

FIGS. 6-8 illustrate exemplary methodologies relating to formation and use of a rectenna that is configured to convert IR radiation to DC energy. While the methodologies are shown and described as being a series of acts that are performed in a sequence, it is to be understood and appreciated that the methodologies are not limited by the order of the sequence. For example, some acts can occur in a different order than what is described herein. In addition, an act can occur concurrently with another act. Further, in some instances, not all acts may be required to implement a methodology described herein.

Now referring to FIG. 6, an exemplary methodology 600 that facilitates forming a rectenna is illustrated. The methodology 600 starts at 602, and at 604, a conductive layer is formed. At 606, an insulator layer is formed directly on the conductive layer. As described above, the insulator layer is thin, on the order of 2-5 nm in thickness. At 608, a metallic grating or FSS is formed on the insulator layer. This results in creation of a nanoantenna that is intimately integrated with a tunnel diode, as the insulator layer acts as a tunnel barrier in the tunnel diode. The methodology 600 completes at 610.

Now referring to FIG. 7, an exemplary methodology 700 for forming a rectenna is illustrated. The methodology 700 starts at 702, and 704, a base wafer is provided. In an example, the base wafer can be an N+ gettered 6-inch diameter base wafer. At 706, an n-type epitaxial silicon layer is grown on the base wafer. At 708, a pad oxide layer is thermally grown on the n-type epitaxial silicon layer. For example, the pad oxide layer may be approximately 10 nm thick.

At 710, a layer of low pressure chemical vapor deposition (LPCVD) silicon nitride cap layer is grown on the pad oxide layer. This cap layer is grown to prevent channeling and restrict dopant out-diffusion. Thickness of the cap layer can be, for example, approximately 20 nm. Subsequently, at 712, a three-stage heavy phosphorus implant can be performed. For instance, the three-stage implant can include a 120 KeV phosphorus implant at a dose of $1.5 \times 10^{16}$ cm$^{-2}$, a 70 KeV phosphorus implant at $7.5 \times 10^{15}$ cm$^{-2}$ and a 30 KeV phosphorus implant at $7.5 \times 10^{15}$ cm$^{-2}$. The phosphorus dose can intentionally spread in depth to avoid exceeding solubility limits locally and to distribute implant damage.

At 714, a furnace anneal can be performed on the stack of layers. In an example, the furnace anneal can be performed at 1050° C. for 60 minutes, wherein such anneal serves to diffuse the dopant deeper into the wafer, anneal damage, and activate the dopant.

At 716, the cap and pad oxide layers can be removed from the stack. In an example, hot phosphoric and 6:1 buffered oxide etch (BOE) wet etches can be used to remove the cap and pad oxide layers. At 717, pre-diffusion cleanse can be performed (e.g., 100:1 BOE 60 seconds+SC1/SC2 dips+100:1 BOE 15 seconds).

At 718, a thin layer of gate oxide is formed on the silicon layer. This can be accomplished through a short thermal oxidation at 900° C. on the n-doped silicon surface, thereby creating a thin (e.g., 3.5 nm) gate oxide. At 720, a metallic layer is sputter-deposited onto the gate oxide layer. For instance, the metallic layer can be a 700 nm Al-1% Cu layer. At 722, the above-mentioned grating or FSS is patterned over the deposited metallic layer. In an example, an ASML model 5500 248 nm DUV scanner using 1.2.6 μm UV6L resist on a 60 nm AR2 bottom anti-reflective layer can be used to pattern the nanoantenna.

At 724, an etch over the exposed areas is performed, such that exposed AlCu film areas are etched through, and the etching continues on to trench into the oxide and silicon surface to a fixed target overetch depth. For instance, this depth can be approximately 200 nm (e.g., thereby forming the ridges in the conductive layer 204 depicted in FIGS. 2 and 3).

At 726, following standard resist strip and post-etch treatments, ILD film can be deposited on the structure in an AMAT HDP tool. For example, the ILD film can have a thickness of approximately 1.6 μm. At 728, the resultant stack is chemical-mechanical polished to a target mean of 200 nm of oxide remaining over AlCu. At 730, ASML DUV lithography, without BARC, is used to define metal pad openings for front contacts, which are opened using a short fluorocarbon-based dry etch in a AMAT eMXP+ Oxide Etch chamber. To provide for an effective back electrical contact, wafer films can be wet stripped in a Semitool Raider backside etcher, and finally a 700 nm AlCu layer is deposited on the wafer backside in an AMAT Endura PVD chamber. The methodology 700 completes at 732.

Turning now to FIG. 8, an exemplary methodology 800 for utilizing the rectenna 100 shown in FIG. 1 is illustrated. The methodology 800 begins at 802, and at 804, a rectenna is electrically coupled to a load. As described above, the rectenna is configured to convert IR radiation to DC energy. At 806, the rectenna is positioned relative to an IR source as desired. At 808, the load is at least partially driven based upon DC energy emitted from the rectenna. The methodology 800 completes at 810.

As used herein, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form. Additionally, as used herein, the term "exemplary" is intended to mean serving as an illustration or example of something, and is not intended to indicate a preference, and the term "about" refers to a range of 10% of the value to which the term applies.

All patents, patent applications, publications, technical and/or scholarly articles, and other references cited or referred to herein are in their entirety incorporated herein by reference to the extent allowed by law. The discussion of those references is intended merely to summarize the assertions made therein. No admission is made that any such patents, patent applications, publications or references, or any portion thereof, are relevant, material, or prior art. The right to challenge the accuracy and pertinence of any assertion of such patents, patent applications, publications, and other references as relevant, material, or prior art is specifically reserved.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known structures, devices, and operations have been shown in block diagram form or without detail in order to avoid obscuring the understanding of the description. Where considered appropriate, reference numerals or terminal portions of reference numerals have been repeated among the figures to indicate corresponding or analogous elements, which may optionally have similar characteristics.

What has been described above includes examples of one or more embodiments. It is, of course, not possible to describe every conceivable modification and alteration of the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

It should also be appreciated that reference throughout this specification to "one embodiment", "an embodiment", "one or more embodiments", or "different embodiments", for example, means that a particular feature may be included in the practice of the invention. Similarly, it should be appreciated that in the description various features are sometimes grouped together in a single embodiment, figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

What is claimed is:

1. A rectenna comprising:
    a nanoantenna that is integrated with a tunnel diode, wherein the rectenna converts infrared (IR) radiation incident upon the rectenna to direct current (DC) energy;
    a conductive layer, wherein the conductive layer comprises a plurality of ridges; and
    an insulator layer positioned between the nanoantenna and the conductive layer.

2. The rectenna of claim 1, the nanoantenna comprising aluminum.

3. The rectenna of claim 2, the patterned shape being one of a grating, a frequency selective surface, or a spiral.

4. The rectenna of claim 3, the patterned shape being aperiodic.

5. The rectenna of claim 1, the conductive layer being one of an n-type substrate, a p-type substrate, or a metal.

6. The rectenna of claim 1, the insulator layer being silicon dioxide.

7. The rectenna of claim 1, the insulator layer having a thickness of between 2 nanometers and 5.5 nanometers.

8. The rectenna of claim 1, the rectenna further comprises a supporting substrate, the conductive layer positioned adjacent the supporting substrate, such that the conductive layer is between the insulator layer and the supporting substrate.

9. The rectenna of claim 1, further comprising a silicon oxide casing that encases the nanoantenna, the conductive layer, and the insulator layer.

10. The rectenna of claim 1, further comprising a layer of oxide formed over the nanoantenna, wherein the nanoantenna is between the layer of oxide and the insulator layer.

11. The rectenna of claim 1, the nanoantenna comprising a frequency selective surface.

12. A method for forming a rectenna, the method comprising:
    forming a conductive layer, wherein the conductive layer comprises a plurality of ridges;
    forming an insulator layer on the conductive layer;
    forming a nanoantenna on the insulator layer, the tunnel diode formed based upon the insulator layer being positioned between the conductive layer and the nanoantenna; and
    integrating the nanoantenna with a tunnel diode, the rectenna configured to convert infrared (IR) radiation into direct current (DC) energy.

13. The method of claim 12, the nanoantenna comprising aluminum.

14. The method of claim 12, the nanoantenna comprising a frequency selective surface.

15. The method of claim 12, the conductive layer being one of an n-type substrate layer, a p-type substrate layer, or a metal layer.

16. The method of claim 12, the insulator layer being a layer of silicon dioxide having a thickness of between 2 nanometers and 5.5 nanometers.

17. The method of claim 12, further comprising encasing the conductive layer, insulator layer, and the nanoantenna with silicon oxide.

18. A rectenna comprising:
- a nanoantenna, wherein the nanoantenna comprises a plurality of spaced-apart bars;
- a conductive layer; and
- an insulator layer positioned between the nanoantenna and the conductive layer, the nanoantenna, the conductive layer, and the insulator layer collectively forming at least one tunnel junction in the rectenna, the rectenna configured to convert infrared (IR) radiation into direct current (DC) energy;
- a silicon oxide layer between each spaced-apart bar of the plurality of spaced apart bars.

19. The rectenna of claim 18, wherein a width of each spaced-apart bar of the plurality of spaced-apart bars is approximately 1.8 µm.

20. The method of claim 18, wherein a period of a grating formed by the plurality of spaced-apart bars ranges between 1 µm and 10 µm.

* * * * *